(12) United States Patent
Bristol

(10) Patent No.: US 6,809,327 B2
(45) Date of Patent: Oct. 26, 2004

(54) EUV SOURCE BOX

(75) Inventor: Robert Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/284,022

(22) Filed: Oct. 29, 2002

(65) Prior Publication Data
US 2004/0079902 A1 Apr. 29, 2004

(51) Int. Cl.[7] .................................................. G01J 1/00
(52) U.S. Cl. .................................................. 250/504 R
(58) Field of Search ...................... 250/504 R, 493.1; 378/119

(56) References Cited

U.S. PATENT DOCUMENTS

| 4,627,088 A | * | 12/1986 | Doucet et al. | ............... 378/119 |
| 6,452,199 B1 | * | 9/2002 | Partlo et al. | ............ 250/504 R |
| 6,566,668 B2 | * | 5/2003 | Rauch et al. | ........... 250/504 R |

* cited by examiner

Primary Examiner—Kiet T. Nguyen
(74) Attorney, Agent, or Firm—Fish & Richardson P.C.

(57) ABSTRACT

Apparatus comprising a plasma source to generate a spectrum of radiation that includes extreme ultraviolet radiation, a reflector to generate a beam of extreme ultraviolet radiation from the spectrum of radiation, and a thin film to pass at least a portion of the extreme ultraviolet radiation.

29 Claims, 3 Drawing Sheets

EUV SOURCE BOX

BACKGROUND

One type of radiation used in semiconductor photolithography is extreme ultraviolet (EUV) radiation. EUV light can be produced by creating a small, hot plasma, which efficiently radiates at a desired wavelength, for example 13.4 nm. The plasma is created in a vacuum chamber, typically by driving a pulsed electrical discharge through a fuel material, or by focusing a pulsed laser beam onto a fuel material. The light produced by the plasma is then collected by nearby mirrors and sent downstream to the rest of the lithography tool.

Debris and gases may be released by this plasma, either directly from the fuel material used, or indirectly from the erosion of nearby materials. The debris and gases may travel downstream the lithography tool and damage sensitive mirrors and other optical components. In addition, the type of fuel used may cause damage. Foil traps, gas curtains, baffling, and shielding are typically used to partially block the debris while allowing an open path for the EUV light to pass through.

DESCRIPTION OF DRAWINGS

Like reference symbols in the various drawings indicate like elements.

DETAILED DESCRIPTION

Figure 1:
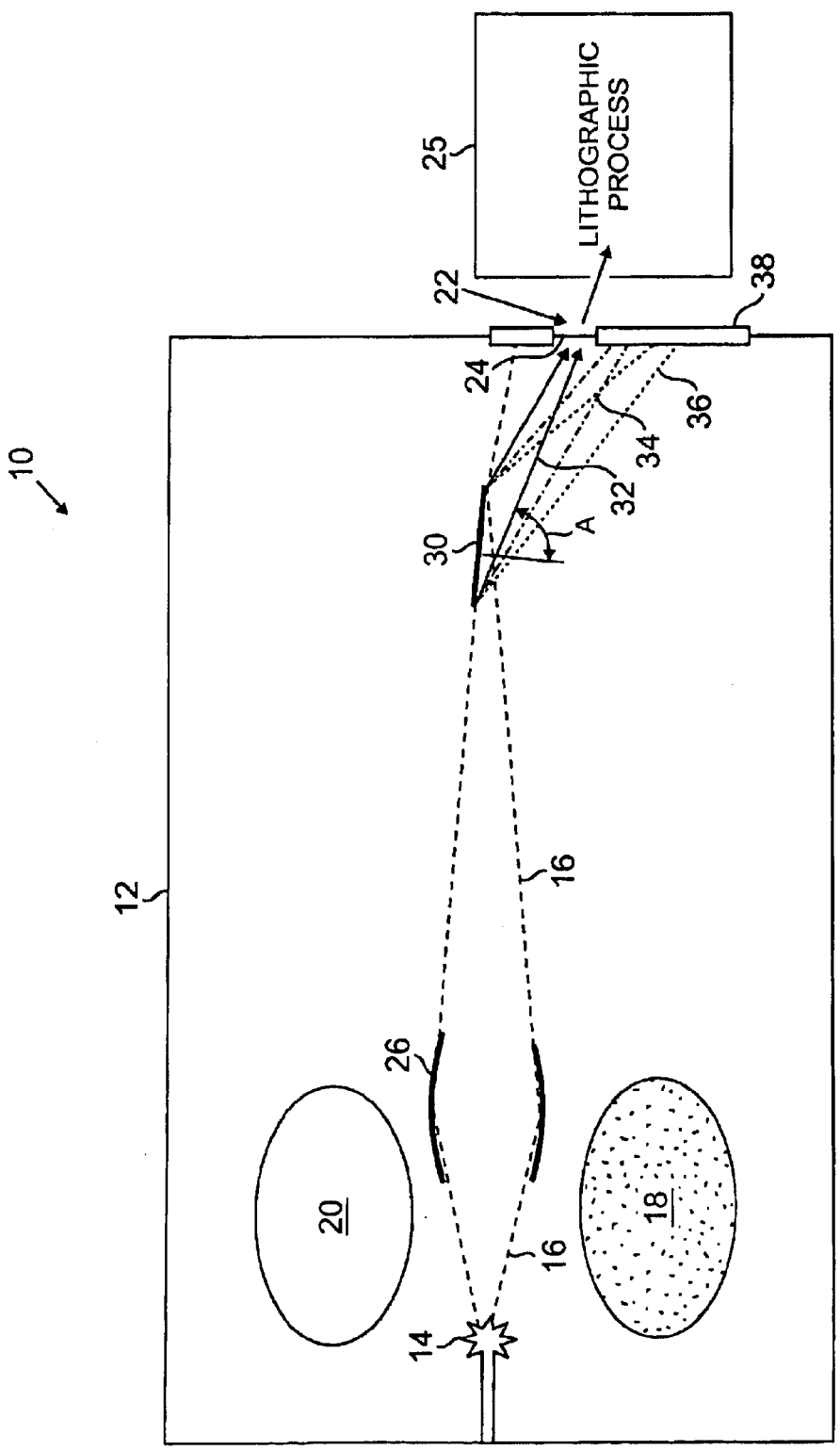
FIG. 1 shows a first example of a sealed EUV source box.

Referring to FIG. 1, an example of an EUV radiation source box 10 is shown. Enclosure 12 contains a radiation source 14 that generates a spectrum of radiation 16 including EUV radiation. Preferably, the wavelength of the EUV radiation is between about 11 nanometers and about 14 nanometers. More preferably, wavelength of the EUV radiation is between about 13 nanometers and about 14 nanometers. Still more preferably, the wavelength of the EUV radiation is about 13.4 nanometers.

Source 14 produces debris 18 and gases 20 that can damage optical components. An exit pupil 22 of enclosure 12 is sealed using a thin film 24. Thin film 24 prevents debris 18 and gases 20 from reaching, and potentially damaging, optical and other components that are located downstream of the exit pupil, such as multilayer mirrors used in the condensor. In one example, enclosure 12 is hermetically sealed. Those skilled in the art will understand that the size of exit pupil 22 and thin film 24 may vary widely depending on the requirements of a particular source box design. In one example, thin film 24 seals an exit pupil having an area of about one square centimeter.

EUV radiation is strongly absorbed by practically all materials; thus thin film 24 must be relatively thin in order to permit transmission of EUV radiation through thin film 24 to downstream lithographic processes 25. Preferably, at least twenty five percent of the EUV radiation is transmitted through thin film 24. More preferably, at least thirty five percent of the EUV radiation is transmitted through thin film 24. Preferably, thin film 24 has a thickness in the range of about 20 nanometers to about 500 nanometers. More preferably, thin film 24 has a thickness in the range of about 50 nanometers to about 160 nanometers. Table 1 shows several examples of thin film 24, available from Luxel Corporation of Friday Harbor, Wash.

TABLE 1

| Material | Thickness (nm) | EUV Transmission |
| --- | --- | --- |
| Zirconium | 150 | 55% |
| Zirconium | 75 | 70% |
| Silicon | 120 | 70% |
| Silicon | 60 | 90% |

Source 14 may include a fuel material that yields a higher conversion efficiency than noble gases. The term "fuel material" includes materials that are used to create a small, hot plasma that radiates at an EUV wavelength, either by use of a pulsed laser or an electric current. Ultimately, using fuel materials with higher conversion efficiencies increases the overall throughput of a lithography tool. Although these elements produce more debris and gases than noble gases, they are kept from damaging downstream optics by sealed enclosure 12 and thin film 24. For example, either Tin or Lithium may yield a higher conversion efficiency than Xenon.

Source box 10 has a reflective diffraction grating 30 disposed within enclosure 12. Thin film 24 may easily overheat if subjected to EUV radiation and other wavelengths of light emitted by source 14. In one example, spectrum 16 is directed toward grating 30 at a grazing incidence A of about 80 degrees by collector mirrors 26. Grating 30 spreads spectrum 16 into several bands of radiation 32, 34, and 36, according to their diffracted angle. By directing only a band containing EUV radiation toward thin film 24, band 32 in this example, and by diverting other heat-carrying bands away from the pupil, the grating 30 reduces the heat load on thin film 24. Thus, thin film 22 can be thin enough to transmit EUV radiation while sealing enclosure 12. Bands of unwanted radiation, such as bands 34 and 36, are directed to heat dump 38 where they are absorbed.

Figure 2:
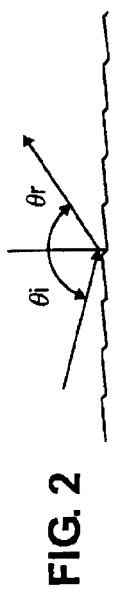
FIG. 2 shows calculated angles of reflection for a range of radiation wavelengths.
Figure 3:
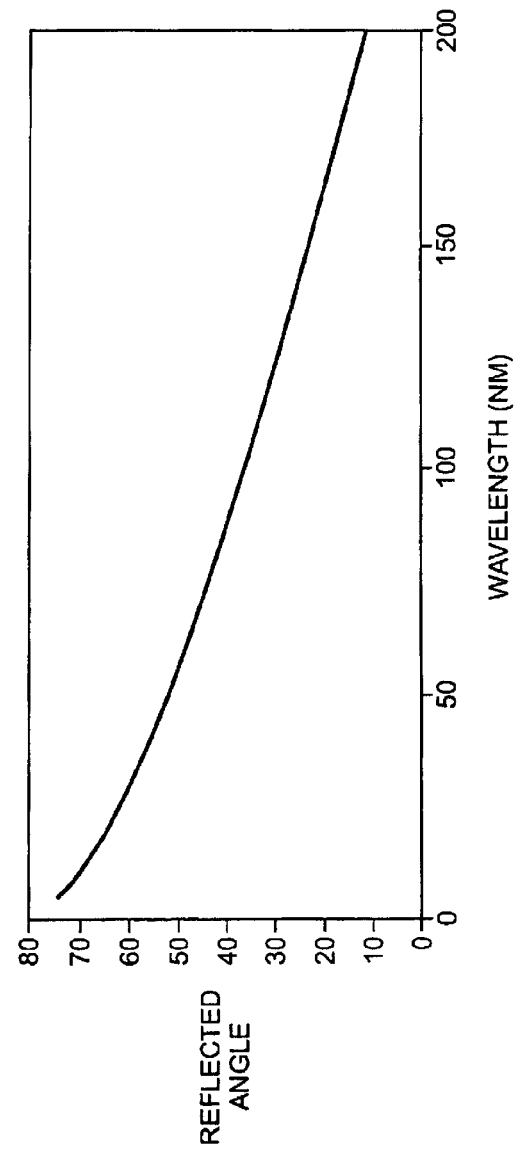
FIG. 3 shows a beam reflecting off of a grating.

Referring to FIGS. 1–3, the angles at which various bands of radiation 32, 34, and 36 will be reflected by grating 30 can be calculated using the grating equation:

$$\sin(\theta_r) = \frac{m * \lambda}{d} + \sin(\theta_i) \qquad (1)$$

where $\theta_i$ is the angle of incidence with relation to the normal, $\theta_r$ is the angle of reflection with relation to the normal, $\lambda$ is, for example, 13.4 nanometers (EUV wavelength), d is the grating groove spacing, and m is the order of the band of reflected radiation (e.g., first, second, third, etc.). In one example, for a grating having a d of 250 nanometers positioned at an incidence angle of 80 degrees, the first inside band (m=−1) reflects at a range of angles plotted in FIG. 3. EUV radiation in band 32 will reflect at about 68 degrees from the normal. Thin film 24 could be placed at this angle at a distance of 10 centimeters and subtende about 5.7 degrees. Thin film 24 then avoids the bulk of the reflected energy in bands 34 and 36.

Grating 30 also serves as a spectral purity filter, eliminating the need for a device to perform a similar function further downstream in the lithography process. Grating 30 has similar efficiency losses whether included in source box 12 or used in a downstream spectral purity filter.

According to simulation, an ideal, properly blazed grating could send 58% of the EUV light to the first inside order at 68 degrees from the normal. Actual efficiencies would be lower, due to both scatter from surface roughness and the less-than-unity reflectivity of the grating coating. At an effective angle of reflection of 16 degrees, a coating of ruthenium has a reflectance of 81 percent, yielding an overall efficiency of about 47 percent. Alternatively a near normal incidence grating of about 10 degrees can yield a theoretical efficiency of 95 percent, but a reasonable reflectance for a multiplayer mirror at such an angle might be about 68 percent, yielding an overall efficiency of about 65 percent.

In one example, approximately 50 watts of EUV radiation needs to be delivered by source box 10 to the entrance of a lithography condenser. Using typical experimental results, about 500 watts of out-of-band radiation, covering 1 to 1000 nanometers in wavelength, may also be produced by source 14 to generate this EUV radiation. Grating 30, disposed at a grazing incidence of 10 degrees and coated with ruthenium, would absorb about ten percent, or 55 watts, of this radiation. Thin film 24 is expected to see about 25 watts of in-band EUV radiation (with the remainder lost to grating inefficiencies) plus about 15 watts of scattered out-of-band energy (this assumes isotropic scattering and a 5 degree acceptance angle of thin film 24). Depending on the choice of materials, discussed above, thin film 24 would absorb approximately 10 to 15 watts of power.

Figure 4:
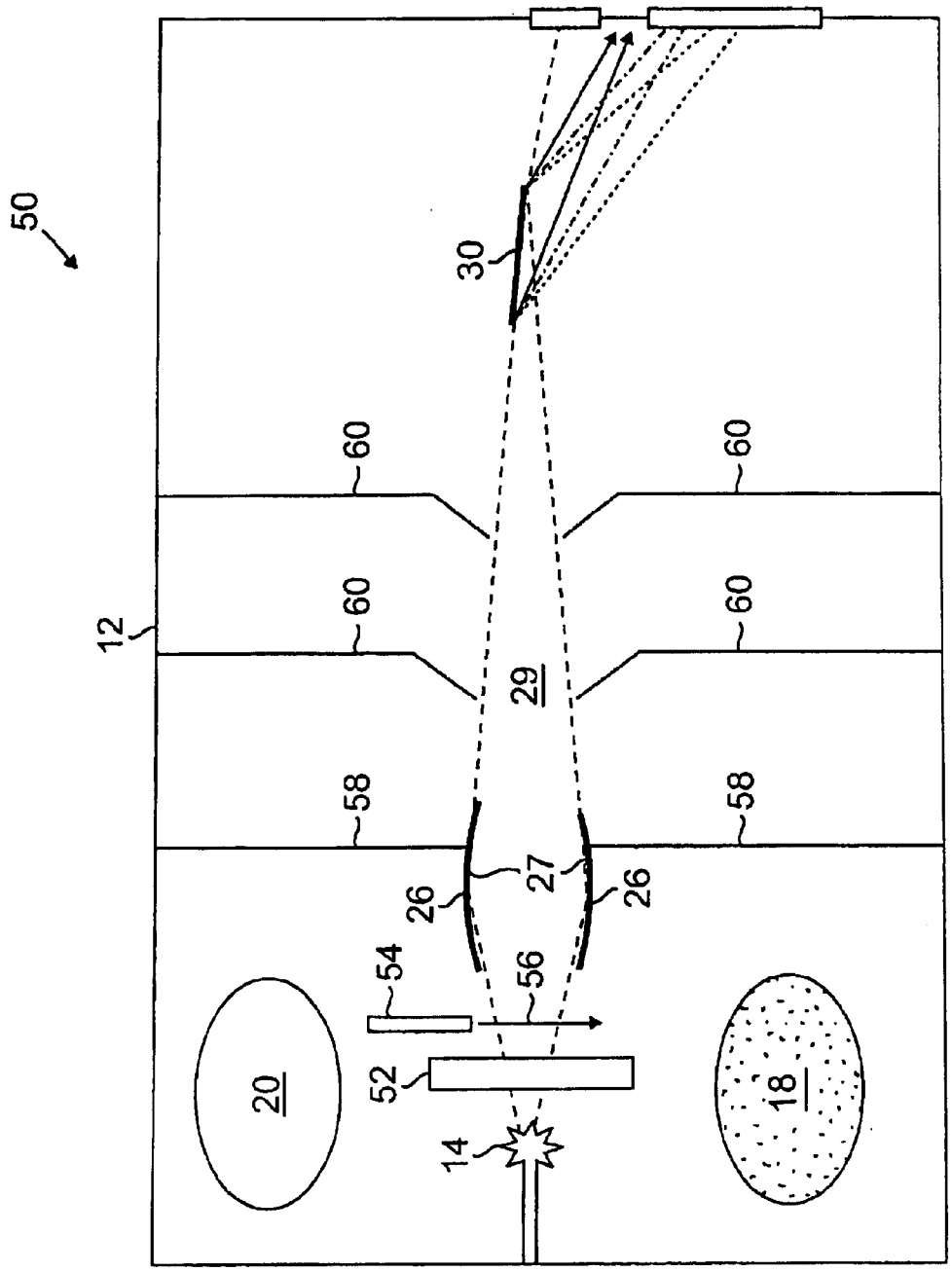
FIG. 4 shows a second example of a sealed EUV source box.

Referring to FIG. 4, EUV source box 50 could include one or more debris mitigation schemes to protect collector mirrors 26 and diffraction grating 30 from debris 18 and gases 20 generated by source 14. In one example, a foil trap 52 is disposed in between source 14 and collector mirrors 26. In another example, a gas curtain 54 could blow a gas 56 in between source 14 and collector mirrors 26 to prevent debris 18 from damaging reflective surfaces 27 of mirrors 26. In another example, shielding 58 surrounds collector mirrors and prevents debris 18 and gas 20 from reaching grating 30 from outside the optical path 29. Finally, in yet another example, source box 50 could include baffling 60 around optical path 29 to further reduce debris 18 and gas 20 from reaching grating 30.

Although some implementations have been described, other embodiments are also within the scope of the following claims.

What is claimed is:

1. Apparatus comprising:
   a plasma source to generate a spectrum of radiation that includes extreme ultraviolet radiation,
   a thin film to pass at least a portion of a beam of extreme ultraviolet radiation, and
   a reflector to separate the beam of extreme ultraviolet radiation from the spectrum and to direct the beam to the thin film.

2. The apparatus of claim 1 further comprising a sealed enclosure and wherein the source and the reflector are disposed within the enclosure.

3. The apparatus of claim 1, wherein the reflector comprises a reflective diffraction grating.

4. The apparatus of claim 3, wherein the grating has a groove spacing in the range of about 50 nanometers to about 500 nanometers.

5. The apparatus of claim 4, wherein the grating has a groove width of about 250 nanometers.

6. The apparatus of claim 1, wherein the beam comprises radiation having a wavelength of about 11 nanometers to about 14 nanometers.

7. The apparatus of claim 6, wherein the beam comprises radiation having a wavelength of about 13.4 nanometers.

8. The apparatus of claim 1, wherein the thin film comprises a material and a thickness such that at least twenty five percent of the beam of radiation having a wavelength of about 11 nanometers to about 14 nanometers is transmitted.

9. The apparatus of claim 8, wherein the material comprises zirconium and the thickness is in the range of about 25 nanometers to about 250 nanometers.

10. The apparatus of claim 9, wherein the thin film has a thickness of about 150 nanometers.

11. The apparatus of claim 9, wherein the thin film has a thickness of about 75 nanometers.

12. The apparatus of claim 8, wherein the thin film comprises silicon and the thickness is in the range of about 50 nanometers to about 500 nanometers.

13. The apparatus of claim 12, wherein the thin film has a thickness of about 120 nanometers.

14. The apparatus of claim 12 wherein the thin film has a thickness of about 60 nanometers.

15. The apparatus of claim 1, wherein the source comprises Tin.

16. The apparatus of claim 1, wherein the source comprises Lithium.

17. The apparatus of claim 1 further comprising a debris mitigation scheme selected from the group consisting of baffling, shielding, a gas curtain, and a foil trap.

18. Apparatus comprising:
   a hermetically sealed enclosure comprising a thin film;
   a source of radiation disposed within the enclosure and configured to generate a spectrum of radiation;
   a reflective diffraction grating disposed within the enclosure and configured to separate a beam of radiation from the spectrum and direct the beam at the thin film, wherein the beam has a wavelength of about 13.4 nanometers;
   a mirror disposed within the enclosure and configured to direct the spectrum toward the grating; and
   a thermal collector disposed within the enclosure and configured to absorb radiation and dissipate heat.

19. The apparatus of claim 18 further comprising a debris mitigation scheme selected from the group consisting of baffling, shielding, a gas curtain, and a foil trap.

20. Apparatus comprising
   a source of radiation that includes extreme ultraviolet radiation and other radiation; and
   a first optical element to separate the extreme ultraviolet radiation from the other radiation and to direct the extreme ultraviolet radiation to a second optical element, the second optical element to receive the extreme ultraviolet radiation and to pass it downstream for further use.

21. The apparatus of claim 20 wherein the first optical element is a reflective diffraction grating.

22. The apparatus of claim 21, wherein the grating has a groove width in the range of about 50 nanometers to about 500 nanometers.

23. The apparatus of claim 22, wherein the grating has a groove width of about 250 nanometers.

24. The apparatus of claim 20, wherein the second optical element is a thin film.

25. The apparatus of claim 24, wherein the thin film comprises zirconium and has a thickness in the range of about 25 nanometers to about 250 nanometers.

26. The apparatus of claim 24, wherein the thin film comprises silicon and has a thickness in the range of about 50 nanometers to about 500 nanometers.

27. A method comprising:
within an enclosure having an interior and an exterior, generating a spectrum of radiation that includes extreme ultraviolet radiation and other radiation;
separating the extreme ultraviolet radiation from the other radiation;
directing the separated extreme ultraviolet radiation to a transmitter; and
transmitting at least a portion of the extreme ultraviolet radiation from the interior of the enclosure to the exterior of the enclosure for use in a downstream process.

28. The method of claim 27 wherein separating the extreme ultraviolet radiation comprises reflecting the spectrum with a reflective diffraction grating.

29. The method of claim 27 wherein transmitting at least a portion of the extreme ultraviolet radiation comprises passing the radiation through a thin film.

* * * * *